US010721019B2

(12) United States Patent
Martin

(10) Patent No.: US 10,721,019 B2
(45) Date of Patent: Jul. 21, 2020

(54) ENCODING VARIABLE LENGTH SYMBOLS TO ENABLE PARALLEL DECODING

(71) Applicant: International Business Machines Corporation, Armonk, NY (US)

(72) Inventor: Andrew K. Martin, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/391,687

(22) Filed: Apr. 23, 2019

(65) Prior Publication Data

US 2019/0253179 A1   Aug. 15, 2019

Related U.S. Application Data

(63) Continuation of application No. 15/356,468, filed on Nov. 18, 2016, now Pat. No. 10,367,604.

(51) Int. Cl.
*H04L 1/00* (2006.01)
*H03M 7/00* (2006.01)
*H03M 7/30* (2006.01)
*H03M 7/40* (2006.01)

(52) U.S. Cl.
CPC .............. *H04L 1/003* (2013.01); *H03M 7/00* (2013.01); *H03M 7/40* (2013.01); *H03M 7/6023* (2013.01)

(58) Field of Classification Search
CPC ........... H04L 1/003; H03M 7/00; H03M 7/40; H03M 7/6023
See application file for complete search history.

(56) References Cited

U.S. PATENT DOCUMENTS

| 5,491,480 | A | 2/1996 | Jan et al. |
|---|---|---|---|
| 5,502,493 | A | 3/1996 | Meyer |
| 5,910,783 | A | 6/1999 | Pazmino |
| 7,088,868 | B1 | 8/2006 | Lidman |
| 8,805,852 | B2 | 8/2014 | Gopal et al. |
| 8,817,771 | B1 | 8/2014 | Zhao et al. |
| 8,824,569 | B2 | 9/2014 | Agarwal et al. |
| 8,949,699 | B1 | 2/2015 | Gustlin |
| 9,100,042 | B2 | 8/2015 | Martin |
| 2013/0148745 | A1 | 6/2013 | Agarwal et al. |

(Continued)

FOREIGN PATENT DOCUMENTS

CN   103248449   11/2017

OTHER PUBLICATIONS

International Search Report and Written Opinion for PCT Application PCT/IB2017/056682, dated Jan. 31, 2018, 11 pages.

(Continued)

*Primary Examiner* — Ronald B Abelson
(74) *Attorney, Agent, or Firm* — VanLeeuwen & VanLeeuwen; Brian D. Welle

(57) ABSTRACT

An approach is provided in which a source system selects a symbol in a first bit stream that is partitioned into at least a first data chunk and a second data chunk. The beginning of the selected symbol resides in the first data chunk. The source system generates a first pull timing indicator in response to determining that at least a portion of the selected first symbol resides in the second data chunk. The source system generates a multiplexed bit stream by combining the first bit stream with a second bit stream based on the first pull timing indicator and transmits the multiplexed bit stream to a destination system.

17 Claims, 12 Drawing Sheets

(56) References Cited

U.S. PATENT DOCUMENTS

2017/0257244 A1 9/2017 Gao et al.
2018/0145791 A1 5/2018 Martin

OTHER PUBLICATIONS

"List of IBM Patents or Patent Applications Treated as Related," Letter from Leslie A. Van Leeuwen, Apr. 23, 2019, 1 page.
"Examination Report under Section 18(3)," for application GB1908207.2, UK Intellectual Property Office, dated Oct. 3, 2019, 2 pages.
"Examination Report under Section 18(3)," for application GB1908207.2, UK Intellectual Property Office, dated Aug. 9, 2019, 4 pages.

ENCODING VARIABLE LENGTH SYMBOLS TO ENABLE PARALLEL DECODING

BACKGROUND

The present disclosure relates to encoding a symbol stream on a source system that has variable length symbols to allow a destination system to use multiple decoders to decode the symbol stream.

Computer systems use compression techniques to reduce the number of bits that are stored in memory or sent over computer networks to other computer systems. Data compression is a technique of reducing the size of a data file by "compressing" a number of bits into a smaller number of bits. Source coding, or encoding, is a compression technique that reduces the amount of bits to transmit over a computer network, such as with data streams.

Data stream compression formats may encode data using variable length "symbols." Due to the symbol length variability, the process of decoding the symbols at a destination system is inherently sequential because the destination system is required to decode a symbol in order to determine a starting location of the next symbol in the data stream.

BRIEF SUMMARY

According to one embodiment of the present disclosure, an approach is provided in which a source system selects a symbol in a first bit stream that is partitioned into at least a first data chunk and a second data chunk. The beginning of the selected symbol resides in the first data chunk. The source system generates a first pull timing indicator in response to determining that at least a portion of the selected first symbol resides in the second data chunk. The source system generates a multiplexed bit stream by combining the first bit stream with a second bit stream based on the first pull timing indicator and transmits the multiplexed bit stream to a destination system.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

Figure 1:
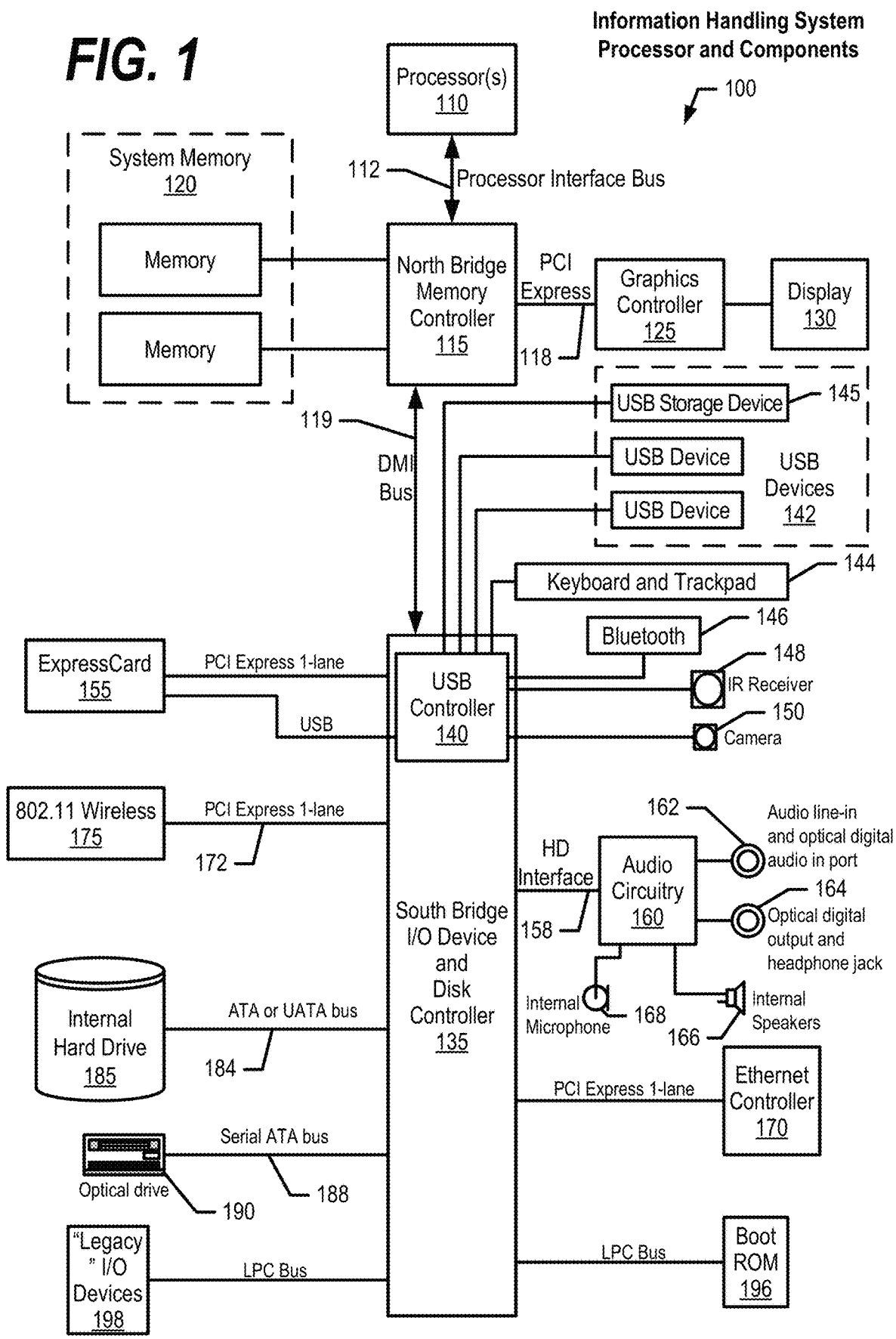
FIG. 1 is a block diagram of a data processing system in which the methods described herein can be implemented.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The following detailed description will generally follow the summary of the disclosure, as set forth above, further explaining and expanding the definitions of the various aspects and embodiments of the disclosure as necessary.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, Peripheral Component Interconnect (PCI) Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a PCI bus connects the Northbridge and the Southbridge. Southbridge 135, also known as the Input/Output (I/O) Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and Universal Serial Bus (USB) connectivity as it connects to Southbridge 135 using both the USB and the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, Integrated Services Digital Network (ISDN) connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera.

Wireless Local Area Network (LAN) device 175 connects to Southbridge 135 via the PCI or PCI Express bus 172. LAN device 175 typically implements one of the Institute of Electrical and Electronic Engineers (IEEE) 802.11 standards of over-the-air modulation techniques that all use the same protocol to wireless communicate between information handling system 100 and another computer system or device. Optical storage device 190 connects to Southbridge 135 using Serial Analog Telephone Adapter (ATA) (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, Automated Teller Machine (ATM), a portable telephone device, a communication device or other devices that include a processor and memory.

Figure 2:
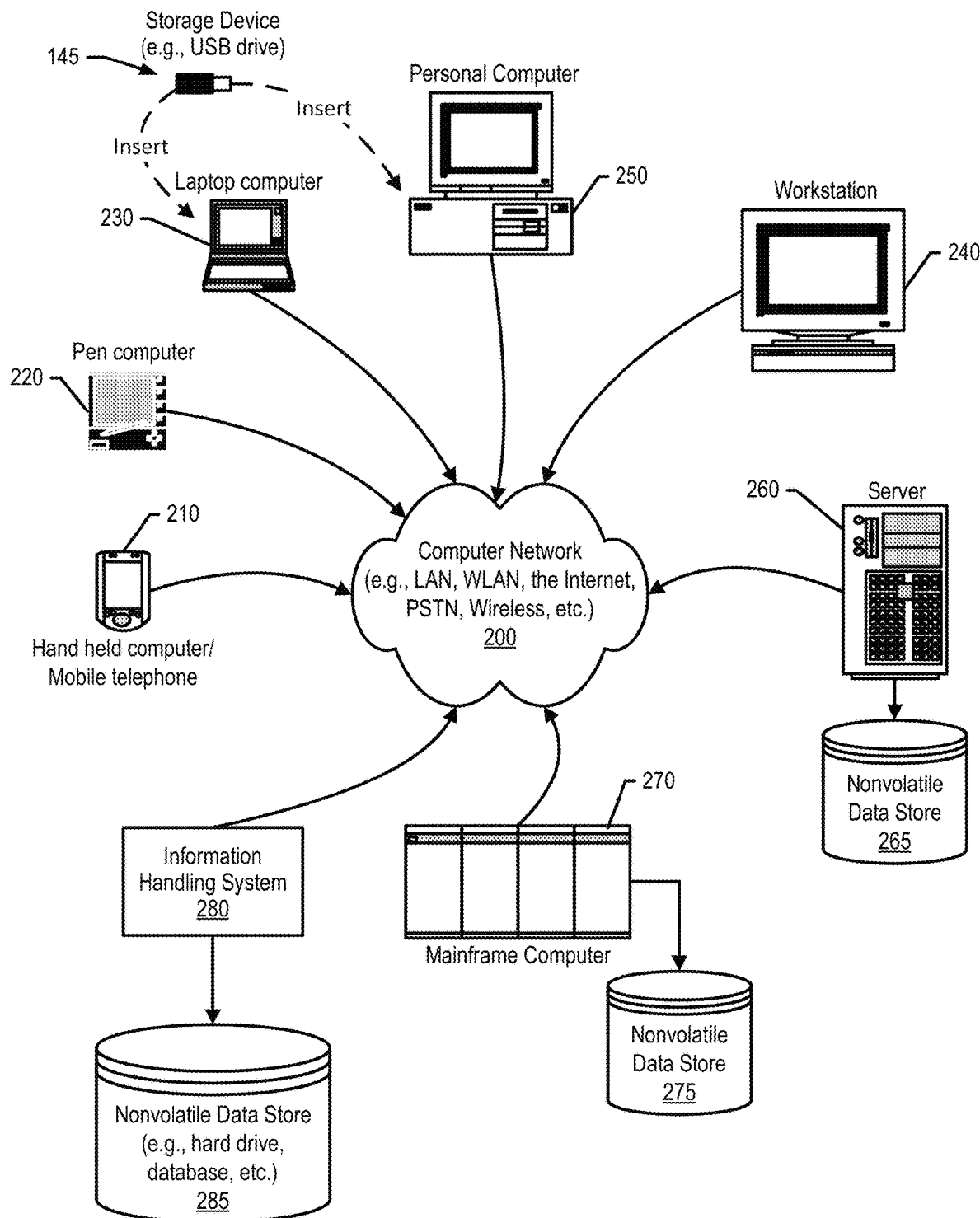
FIG. 2 provides an extension of the information handling system environment shown in FIG. 1 to illustrate that the methods described herein can be performed on a wide variety of information handling systems which operate in a networked environment.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as Moving Picture Experts Group Layer-3 Audio (MP3) players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280. As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

FIGS. 3 through 12 depict an information handling system that encodes a symbol stream having variable length symbols on a source system for a destination system to perform parallel decoding of a multiplexed bit stream. As discussed earlier, today's compressed data formats consist of a stream of variable length symbols and, as a result, the process of decoding these symbol streams is inherently sequential and difficult to parallelize the decoding process to increase performance.

To alleviate this challenge, a source system performs conversion steps on an incoming symbol stream to enable a destination system to perform parallel decoding. The initial symbol stream is de-multiplexed into n (e.g. 4) independent symbol sub-streams, which are then partitioned into fixed bit-width data chunks with corresponding pull timing information that corresponds to locations of symbols relative to boundaries of the fixed bit-width data chunks. The fixed bit-width data chunks are then multiplexed together based on the pull timing information and sent to a destination system.

The destination system uses a bit stream partitioner that breaks the multiplexed bit streams in to fixed bit-width data chunks and feeds the fixed bit-width data chunks to multiple decoders at the decoders' request. The multiple decoders decode symbols in parallel and feed the decoded symbols into a combiner. The combiner combines the symbols into a decoded symbol stream and sends the decoded symbol stream to post-processing.

Figure 3:
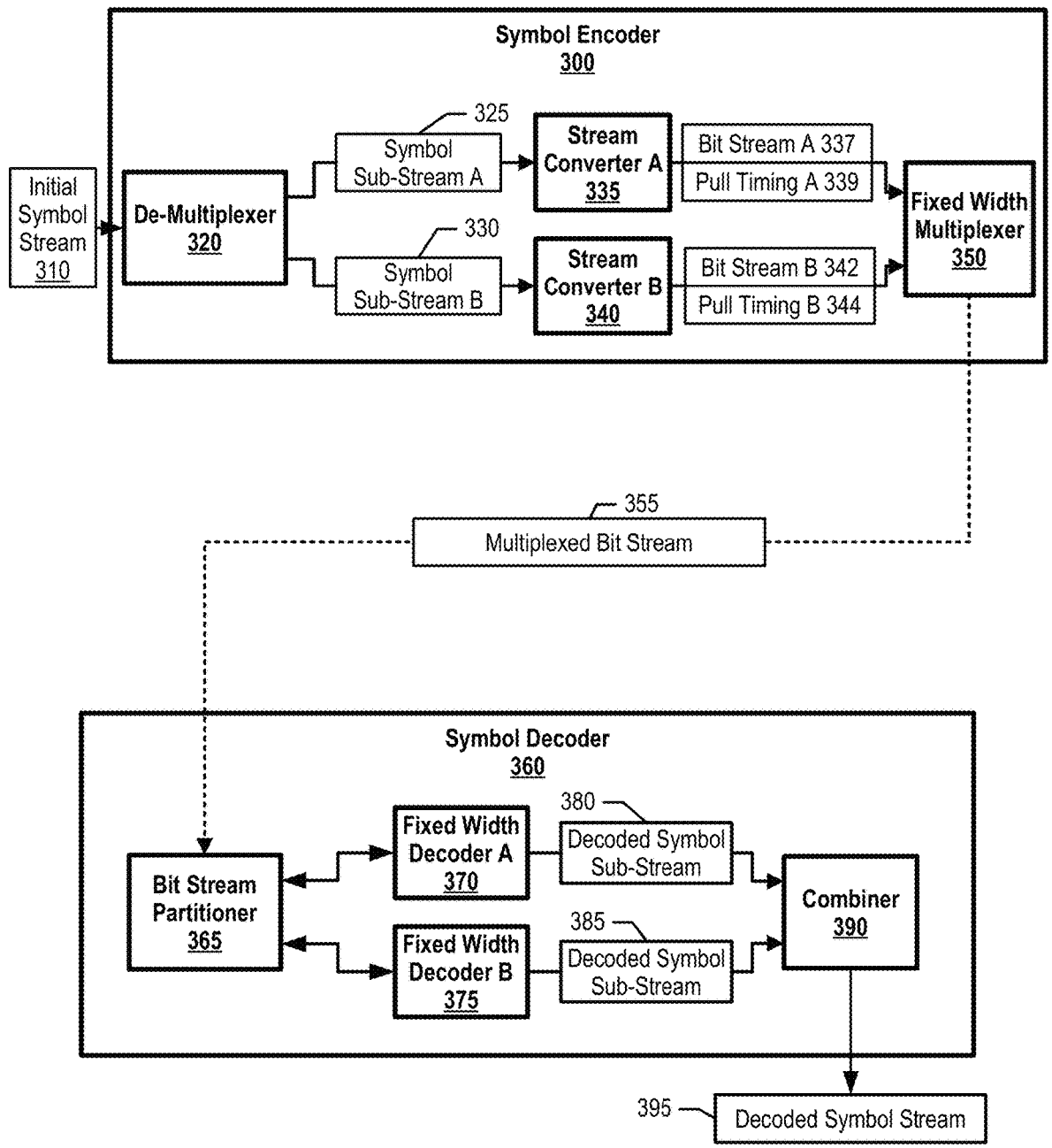
FIG. 3 is a diagram depicting a source symbol encoder converting an initial symbol stream into a multiplexed bit stream and a destination symbol decoder using multiple decoders to convert the multiplexed bit stream into a decoded symbol stream.

FIG. 3 is a diagram depicting a source symbol encoder converting an initial symbol stream into a multiplexed bit stream and a destination symbol decoder using multiple decoders to convert the multiplexed bit stream into a decoded symbol stream.

Symbol encoder 300 receives initial bit stream 310 that, in one embodiment, includes symbols with variable lengths (e.g., Huffman Gzip stream). De-multiplexer 320 de-multiplexes initial symbol stream 310 into symbol sets, which are symbol sub-streams 325 and 330. The example in FIG. 3 shows two de-multiplexed symbol sub-streams 325 and 330. In this example, de-multiplexer 320 stores the first symbol from initial symbol stream 310 in symbol sub-stream 325, stores the second symbol from initial symbol stream 310 in symbol sub-stream 330, stores the third symbol from initial symbol stream 310 back into symbol sub-stream 325, etc. (see FIG. 5 and corresponding text for further details).

Stream converter A 335 and stream converter B 340 concurrently partition their corresponding symbol sub-streams into fixed bit-width data chunks, which are stored in bit stream A 337 and bit stream B 342. The size of the fixed bit-width data chunks match the size of the buffers utilized by the fixed width decoders A 370 and B 375 in destination symbol decoder 360 (e.g., 16 bits). Stream converter A 335 and stream converter B 340 also generate pull timing A 339 and pull timing B 344 that corresponds to locations of the symbols relative to boundaries of the fixed bit-width data chunks (see FIG. 6 and corresponding text for processing details). The pull timing information is used by fixed width multiplexer 350 to properly organize the fixed bit-width data chunks from stream converter A 335 and B 340 into multiplexed bit stream 355 so as to match the times at which fixed width decoder A 370 and B 375 will request, or "pull," fixed bit-width data chunks from bit stream partitioner 365 discussed below.

Symbol decoder 360's bit stream partitioner 365 partitions multiplexed bit stream 355 into fixed bit-width data chunks (same size as the fixed bit-width data chunks partitioned by symbol encoder 300). Fixed width decoder A 370 and B 375 first request fixed bit-width data chunks from bit stream partitioner 365 to initially load their corresponding buffers (e.g., two buffers). Then, fixed width decoder A 370 and B 375 begin concurrently decoding the symbols in their loaded fixed bit-width data chunks. When the fixed width decoders A 370 or B 375 require more fixed bit-width data chunks, such as when one of the decoded symbols reaches the boundary of its first buffer, the decoder requests another fixed bit-width data chunk from bit stream partitioner 365 (see FIGS. 11-12 and corresponding text for further details).

The fixed width decoders produce decoded symbol streams 380 and 385, which combiner 390 combines in a round robin manner into decoded symbol stream 395 and is ready for post-processing. Symbol decoder 360, in turn, increases decoding performance by using multiple fixed width decoders to perform parallel decoding.

Figure 4:
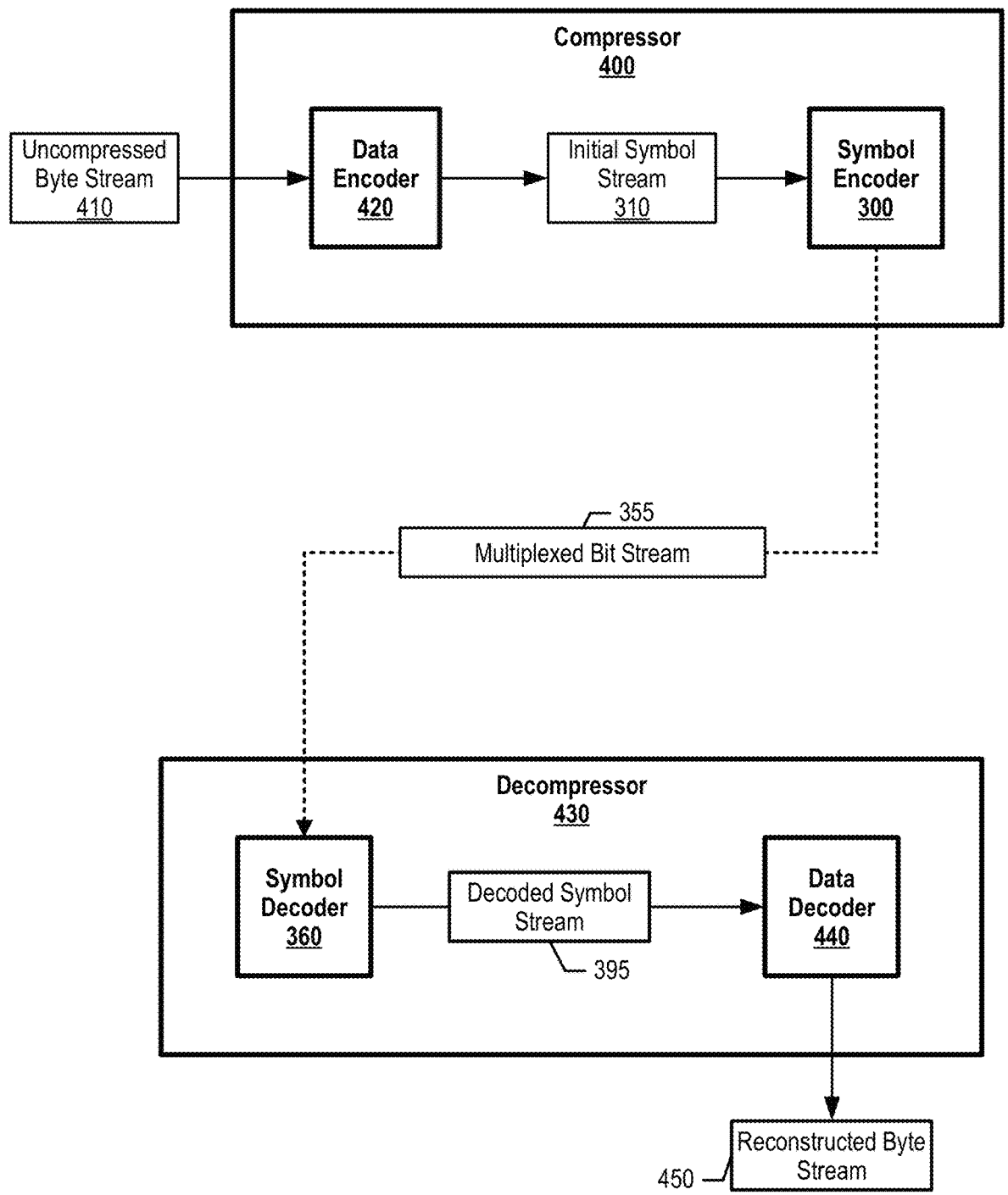
FIG. 4 is a high level diagram showing a compressor and decompressor utilizing the symbol encoder and symbol decoder shown in FIG. 3.

FIG. 4 is a high level diagram showing a compressor and decompressor utilizing the symbol encoder and symbol decoder shown in FIG. 3. Compressor 400 includes data encoder 420, which receives uncompressed byte stream 410 and creates initial symbol stream 310. Initial symbol stream 310 feeds into symbol encoder 300, which generates multiplexed bit stream 355 as discussed above.

Decompressor 430 includes symbol decoder 360, which generates decoded symbol stream 395 as discussed above. Data decoder 440, in turn, decodes the symbols in decoded symbol stream 395 to generate reconstructed byte stream 450.

Figure 5:
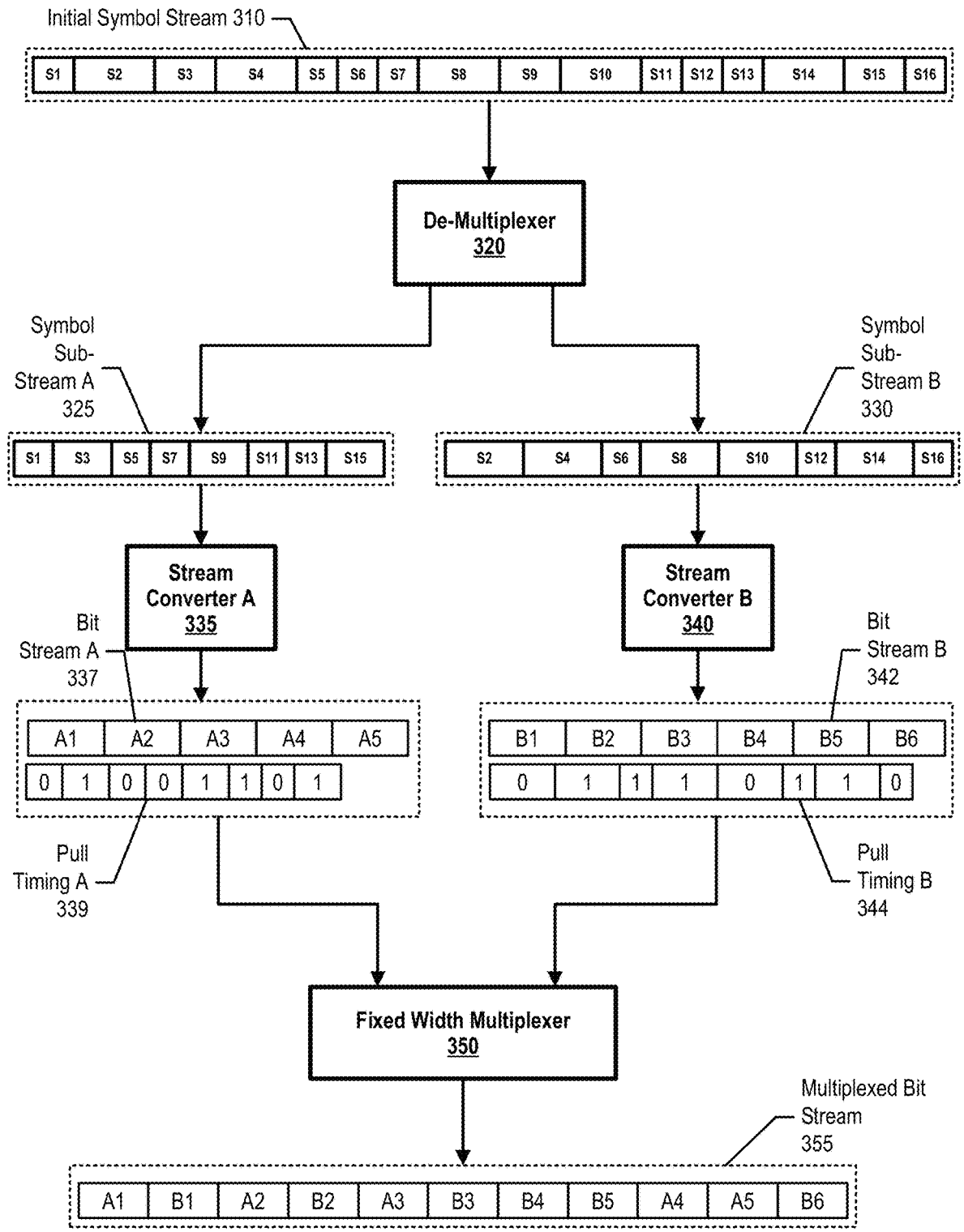
FIG. 5 is a detailed diagram depicting stages of an initial symbol stream being converted to a multiplexed bit stream.

FIG. 5 is a detailed diagram depicting stages of an initial symbol stream being converted to a multiplexed bit stream. Initial symbol stream 310 includes variable length symbols S1, S2, S3, S4, S5, S6, S7, S8, S9, S10, S11, S12, S13, S14, S15, and S16. Demultiplexer 320 separates out the symbols in sequential order to symbol sub-stream A 325 and symbol sub-stream B 330. As can be seen, symbol sub-stream A 325 includes symbols S1, S3, S5, S7, S9, S11, S13, and S15, and symbol sub-stream B 330 includes symbols S2, S4, S6, S8, S10, S12, S14, and S16.

Stream converter A 335 partitions symbol sub-stream A 325 into fixed bit-width data chunks A1, A2, A3, A4, and A5, and stores the fixed bit-width data chunks into bit stream A 337. Stream converter A 335 also generates pull timing A 339, which includes 1's in slots at times that symbols from symbol sub-stream A 325 cross over a boundary of a fixed bit-width data chunk (see FIG. 6 and corresponding text for further details).

Likewise, stream converter B 340 partitions symbol sub-stream B 330 into fixed bit-width data chunks B1, B2, B3, B4, B5, and B6, and stores the fixed bit-width data chunks into bit stream B 342. Stream converter B 340 also generates pull timing B 344 that includes 1's in slots at times that symbols from symbol sub-stream B 330 cross over a boundary of one of its fixed bit-width data chunks.

Fixed width multiplexer 350 then proceeds through a process of combining fixed bit-width data chunks from bit stream A 337 and bit stream B 342. Fixed width multiplexer 350 first loads fixed bit-width data chunks A1, then B1, then A2, the B2 because fixed width decoders A 370 and B 375 perform an initial load of their two buffers. Next, fixed width multiplexer 350 analyzes pull timing A 339 and B 344 to determine when to load fixed bit-width data chunks from either bit stream A 337 or B 342 (see FIG. 7 and corresponding text for further details). In turn, fixed width multiplexer 350 sends multiplexed bit stream 355 over a computer network to symbol decoder 360 for later decoding. In one embodiment, fixed width multiplexer 350 stores multiplexed bit stream 355 in a storage area for later retrieval.

Figure 6:
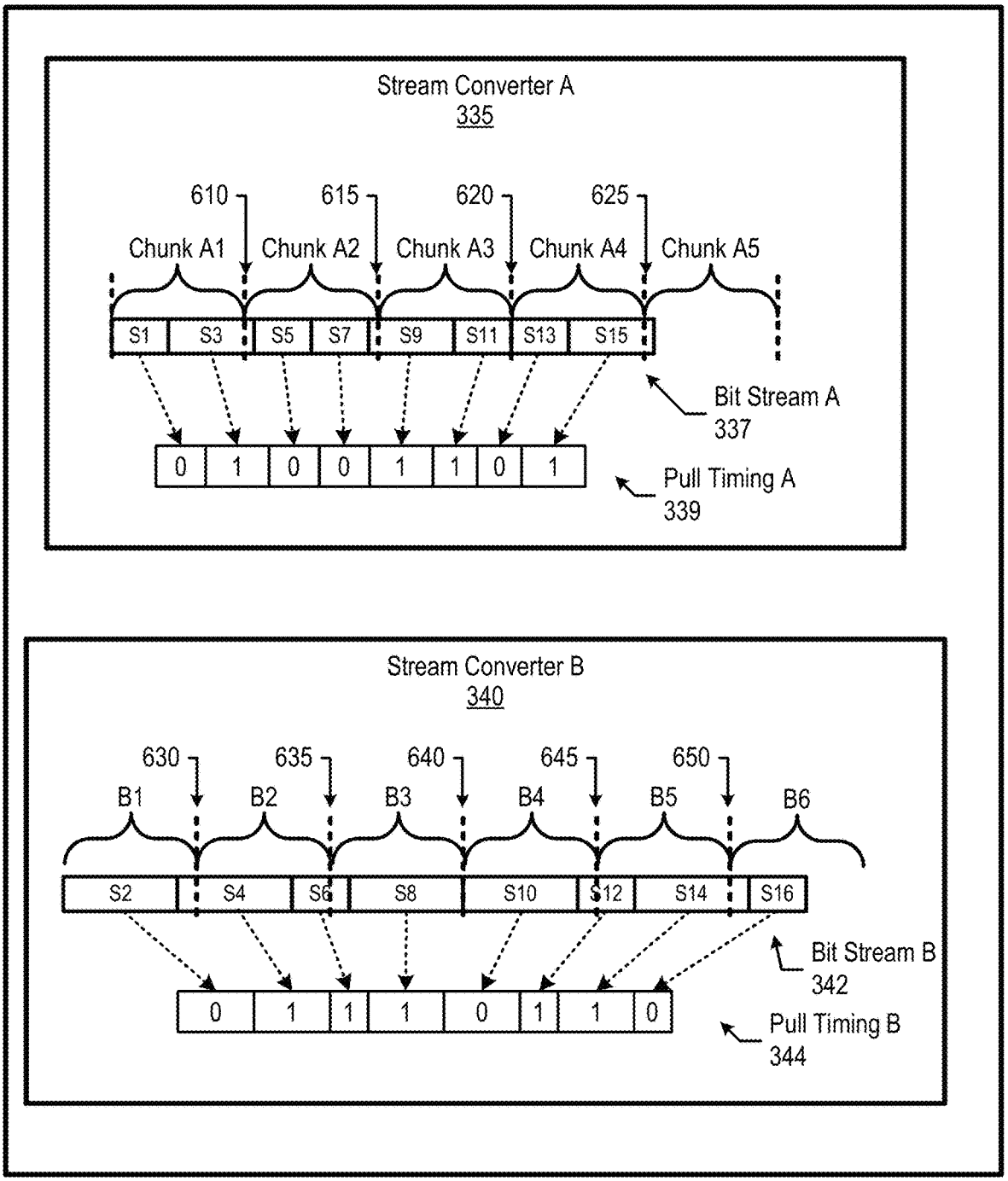
FIG. 6 is a diagram depicting stream converters partitioning bit streams into fixed bit-width data chunks and generating pull timing.

FIG. 6 is a diagram depicting stream converters partitioning bit streams into fixed bit-width data chunks and generating pull timing. Stream converter A 335 partitions bit stream A 337 into fixed bit-width data chunks A1, A2, A3, A4, and A5. The fixed bit-width data chunks correspond to the size of the buffers utilized by the fixed width decoders because the fixed width decoders will be requesting data chunks of the same size from bit stream partitioner 365 (discussed below). For example, if the buffer size of fixed width decoder A 370 is 16 bits, then stream converter A 335 uses a fixed bit-width data chunk size of 16 bits.

Stream converter A 335 then analyzes the symbols S1, S3, S5, S7, S9, S11, S13, and S15 relative to the boundaries of the fixed bit-width data chunks. When one of the symbols crosses a boundary, stream converter A 335 loads a 1 into pull timing A 339 because the decoders at symbol decoder 360 will be requesting another fixed bit-width data chunk at that time, which is why fixed width multiplexer 350 loads the fixed bit-width data chunks in an order based on the pull timing (see FIG. 12 and corresponding text for further details). Based on the example shown in FIG. 6, stream converter A 335 analyzes the symbols and performs the following steps per symbol:

S1 does not cross boundary, load 0 into pull timing A 339;
S3 crosses boundary 610, load 1 into pull timing A 339;
S5 does not cross boundary, load 0 into pull timing A 339;
S7 does not cross boundary, load 0 into pull timing A 339;
S9 crosses boundary 615, load 1 into pull timing A 339;
S11 crosses boundary 620, load 1 into pull timing A 339;
S13 does not cross boundary, load 0 into pull timing A 339; and
S15 crosses boundary 625, load 1 into pull timing A 339.

Likewise, stream converter B 340 partitions bit stream B 342 into fixed bit-width data chunks B1, B3, B3, B4, B5, and B6. Stream converter B 340 then analyzes the symbols S2, S4, S6, S8, S10, S12, S14, and S16 relative to the fixed bit-width data chunk boundaries. Based on the example shown in FIG. 6, stream converter B 340 analyzes the symbols and performs the following steps per symbol:

S2 does not cross boundary, load 0 into pull timing B 344;
S4 crosses boundary 610, load 1 into pull timing B 344;
S6 crosses boundary 610, load 1 into pull timing B 344;
S8 crosses boundary 610, load 1 into pull timing B 344;
S10 does not cross boundary, load 0 into pull timing B 344;
S12 crosses boundary 620, load 1 into pull timing B 344;
S14 crosses boundary 610, load 1 into pull timing B 344; and
S16 does not cross boundary, load 0 pull timing B 344.

Figure 7:
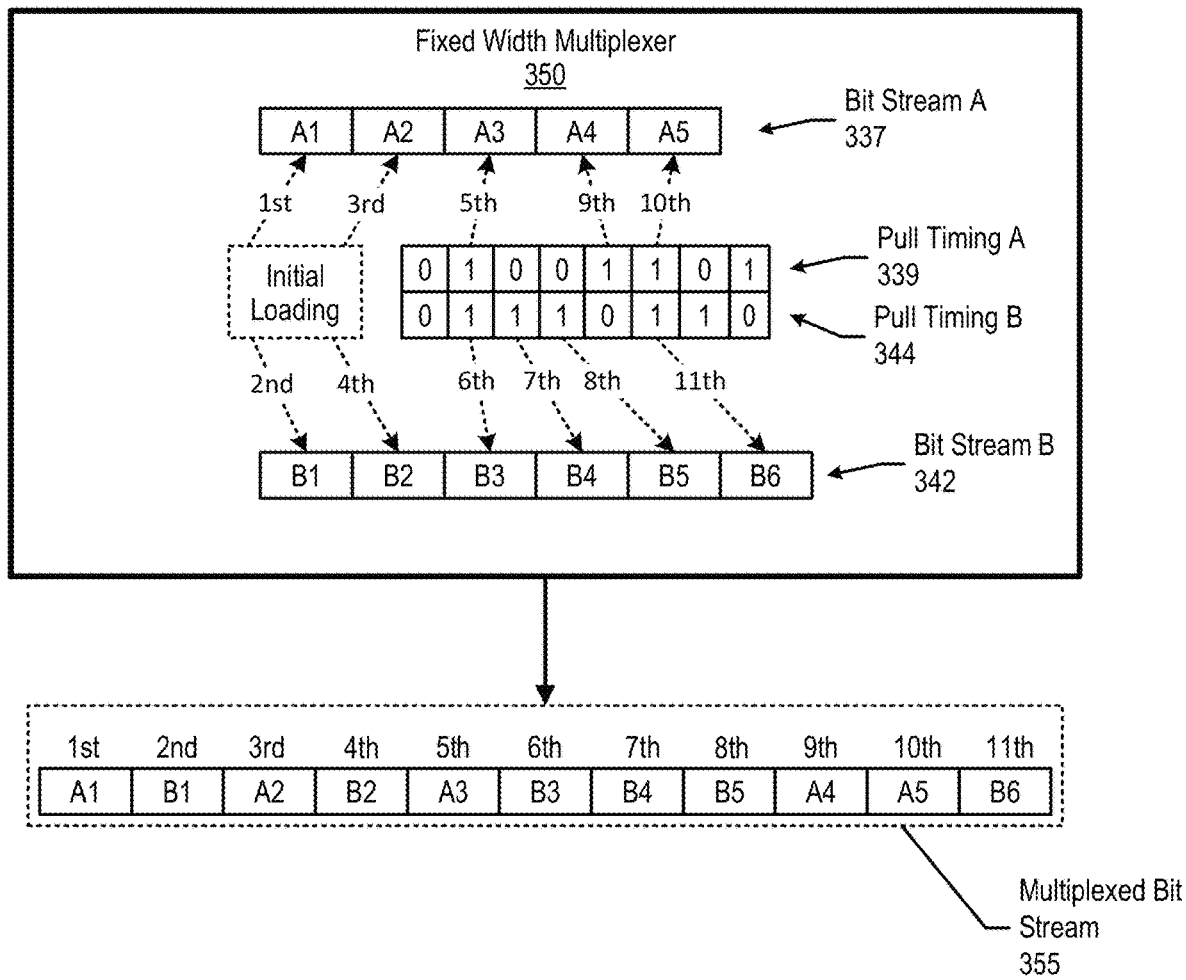
FIG. 7 is a diagram depicting an approach by a fixed width multiplexer to load fixed bit-width data chunks from multiple bit streams in an order consistent with how the fixed bit-width data chunks will be processed by destination fixed width symbol decoders.

Fixed width multiplexer 350 then uses the pull timing to insert the fixed bit-width data chunks from bit stream A 337 and bit stream B 342 in particular order (see FIG. 7 and corresponding text for further details).

FIG. 7 is a diagram depicting an approach by fixed width multiplexer 350 to load fixed bit-width data chunks from multiple bit streams in an order consistent with how the fixed bit-width data chunks will be processed by fixed width decoders A 370 and B 375 in symbol decoder 360.

Figure 11:
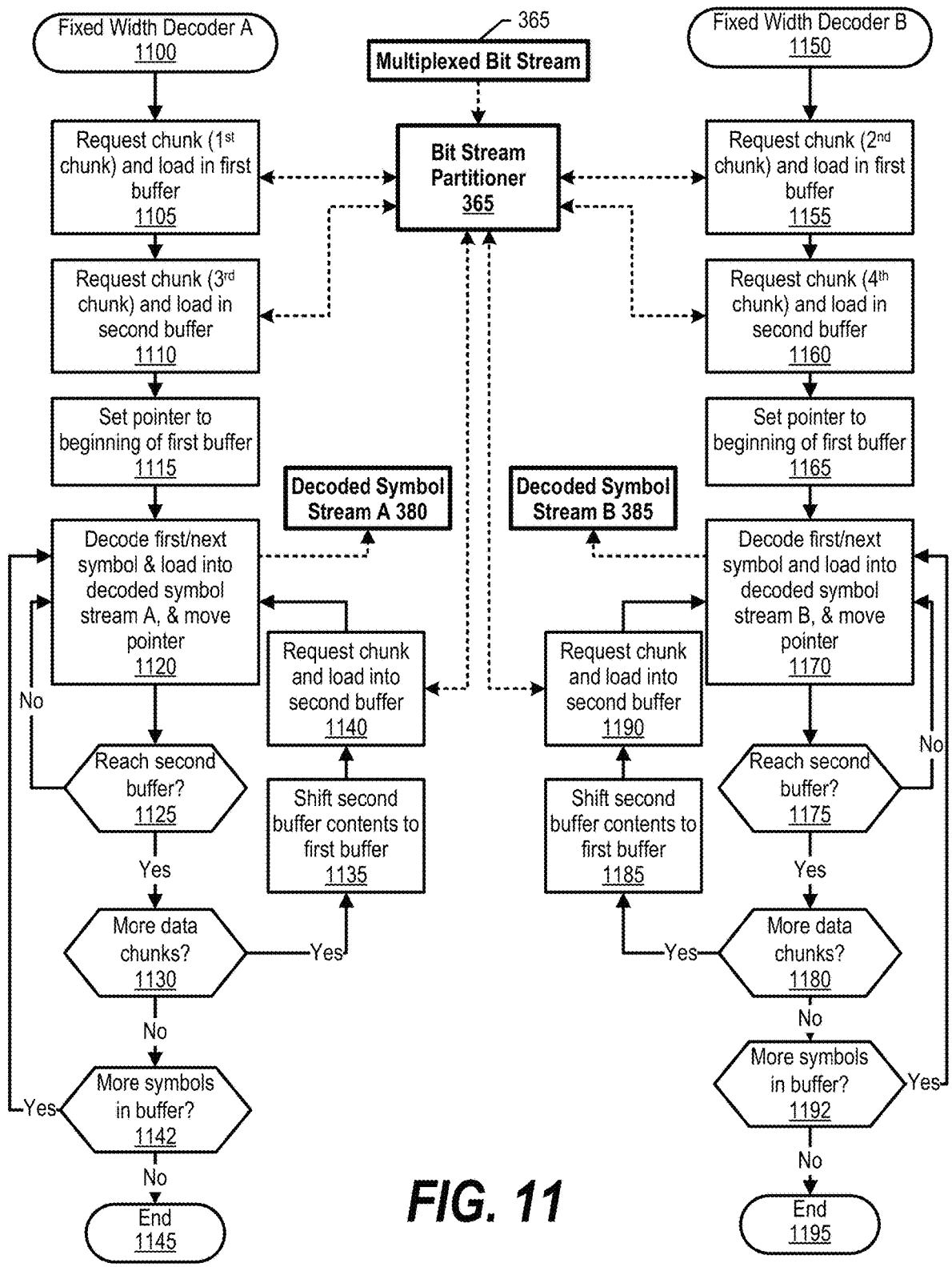
FIG. 11 is a flowchart showing steps by a destination system to perform parallel decoding of an incoming multiplexed bit stream.
Figure 12:
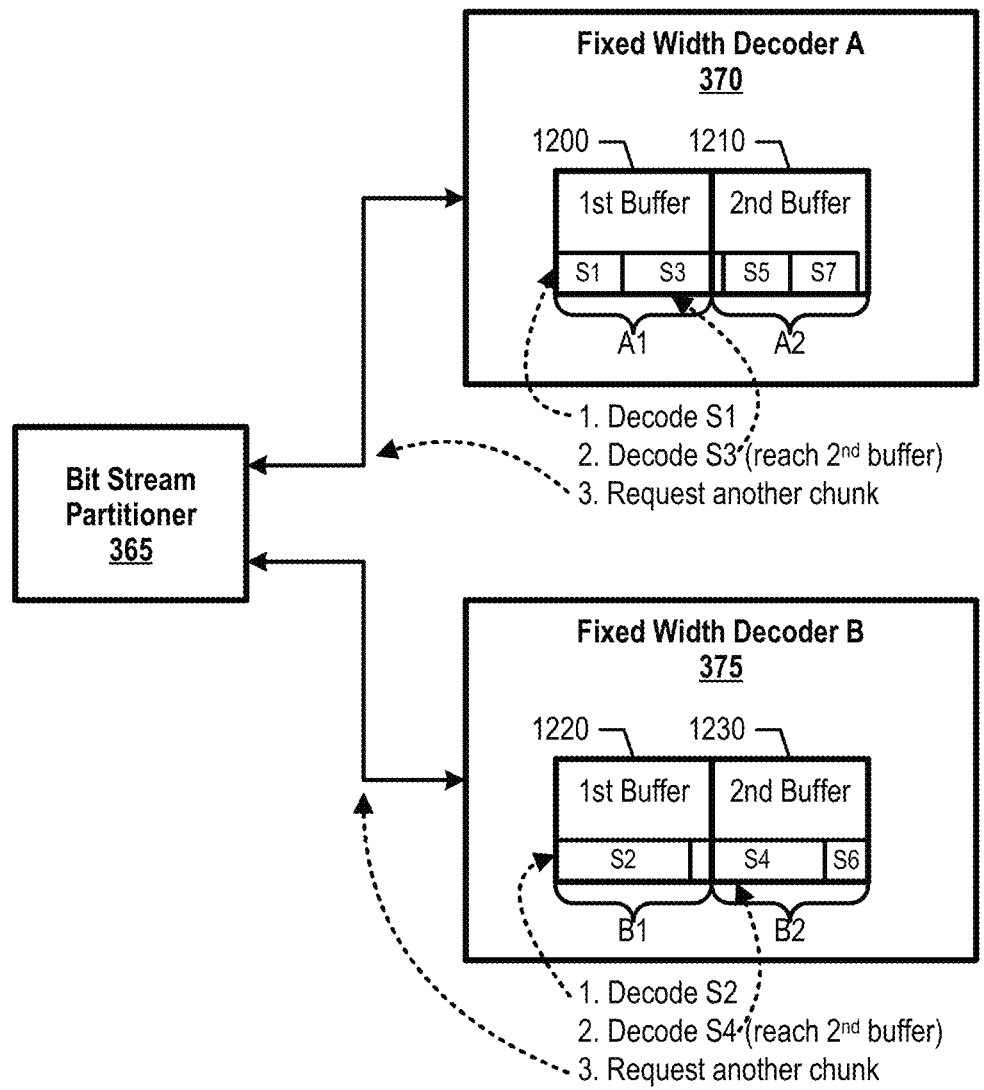
FIG. 12 is a diagram showing an example of multiple fixed width decoders interfacing with a bit stream partitioner to request and process fixed bit-width data chunks.

The fixed width decoders, as shown in FIGS. 11-12, first perform an initial load of their buffers in sequential order. As such, fixed width multiplexer 350 loads chunk A1, then B1, then A2, then B2 in slots 1, 2, 3, and 4 of multiplexed bit stream 355.

Next, fixed width multiplexer 350 looks to pull timing A 339 and B 344 in sequential order to determine which fixed bit-width data chunks to load next. Neither pull timing A 339 nor pull timing B 344 include a 1 in their first slot, so fixed width multiplexer 350 does nothing. Pull timing A 339 includes a 1 in the second slot so fixed width multiplexer 350 loads chunk A3 in the 5th slot of multiplexed bit stream 355. Pull timing B 344 also includes a 1 in the second slot so fixed width multiplexer 350 loads chunk B3 in the 6th slot of multiplexed bit stream 355. Pull timing A 339 includes a 0 in the third slot so nothing is loaded. Pull timing B 344 includes a 1 in the third slot so fixed width multiplexer 350 loads B4 in the 7th slot of multiplexed bit stream 355.

Continuing on, pull timing A 339 includes a 0 in the fourth slot so nothing is loaded. Pull timing B 344 includes a 1 in the fourth slot so fixed width multiplexer 350 loads B5 in the 8th slot of multiplexed bit stream 355. Pull timing A 339 includes a 1 in the fifth slot so fixed width multiplexer 350 loads A4 in the 9th slot of multiplexed bit stream 355. Pull timing B 344 includes a 0 in the fifth slot so nothing is loaded. Pull timing A 339 includes a 1 in the sixth slot so fixed width multiplexer 350 loads A5 in the 10th slot of multiplexed bit stream 355. Pull timing B 344 also includes a 1 in the sixth slot so fixed width multiplexer 350 loads B6 in the 11th slot of multiplexed bit stream 355. In one embodiment, such as that shown in FIG. 7, not all of the pull timing will be utilized due to the initial loading of the fixed-width data chunks as discussed above.

Figure 8:
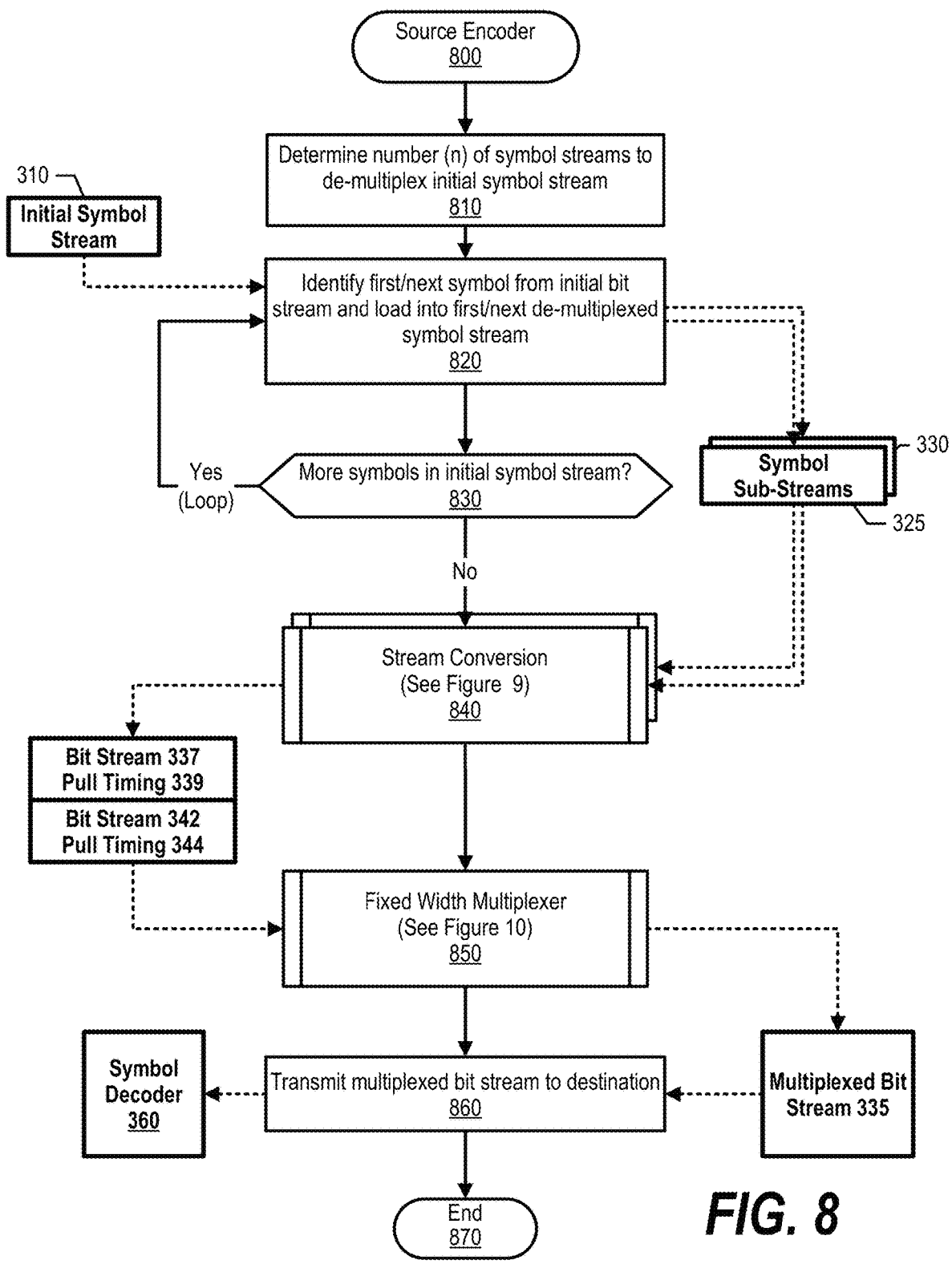
FIG. 8 is a high-level flowchart showing a source encoder that generates a multiplexed bit stream that is sent to a destination symbol decoder for parallel decoding.

FIG. 8 is a high-level flowchart showing a source encoder that generates a multiplexed bit stream that is sent to a destination symbol decoder for parallel decoding. Processing commences at 800 whereupon, at step 810, the process determines a number (n) of symbol sub-streams to de-multiplex an initial bit stream (e.g., n=2). At step 820, the process identifies the first symbol in initial bit stream 310 and loads the first symbol into the first symbol sub-stream (e.g., symbol sub-stream 325).

The process then determines as to whether more symbols are in initial symbol stream 310 (decision 830). If more symbols are in initial symbol stream 310, then decision 830 branches to the 'yes' branch which loops back to identify the next symbol and load the next symbol into the next symbol sub-stream 330. This looping continues to load symbols in sequential manner from initial bit stream 310 to the appropriate symbol sub-stream (e.g., 325, 330, 325, 330 . . . ) until there are no more symbols in initial symbol stream 310, at which point decision 830 branches to the 'no' branch exiting the loop.

At predefined process 840, for each of the symbol sub-streams, the process partitions the symbol sub-streams into fixed bit-width data chunks and loads the fixed bit-width data chunks into their corresponding bit streams 337 and 342. The process also generates pull timing information as discussed herein that corresponds to locations of the symbols relative to boundaries of the fixed bit-width data chunks (see FIG. 9 and corresponding text for processing details).

Figure 10:
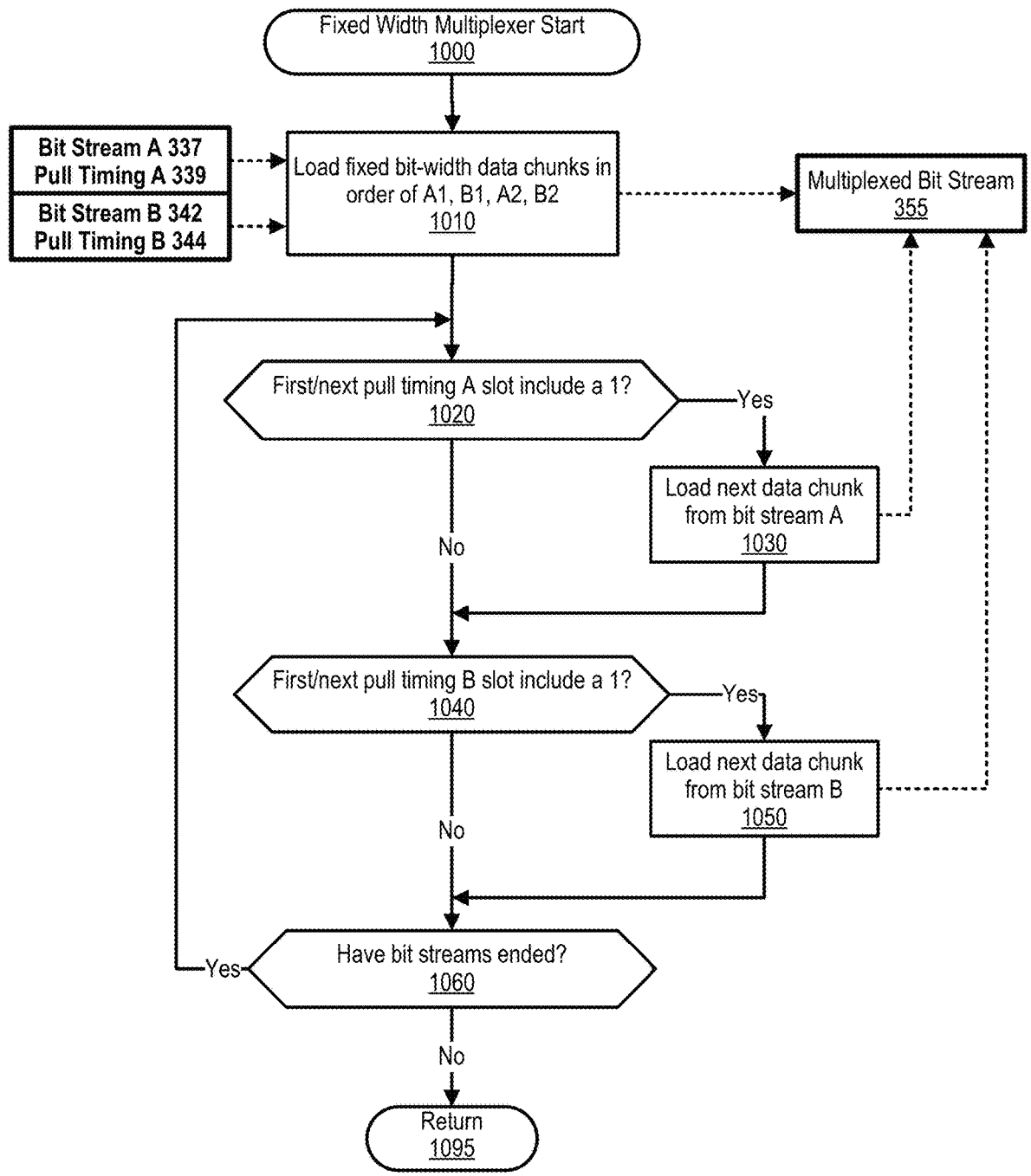
FIG. 10 is a flowchart showing steps taken by a fixed width multiplexer to combine fixed bit-width data chunks from multiple bit streams into a multiplexed bit stream based on pull timing information.

At predefined process 850, the process combines the fixed bit-width data chunks from the multiple bit streams into a multiplexed bit stream based on the pull timing information (see FIG. 10 and corresponding text for processing details). The process then sends the multiplexed bit stream to symbol decoder 360 at step 860 and FIG. 8 processing thereafter ends at 870. Symbol decoder 360, in turn, performs parallel decoding of multiplexed bit stream 335 (see FIGS. 11, 12, and corresponding text for further details).

Figure 9:
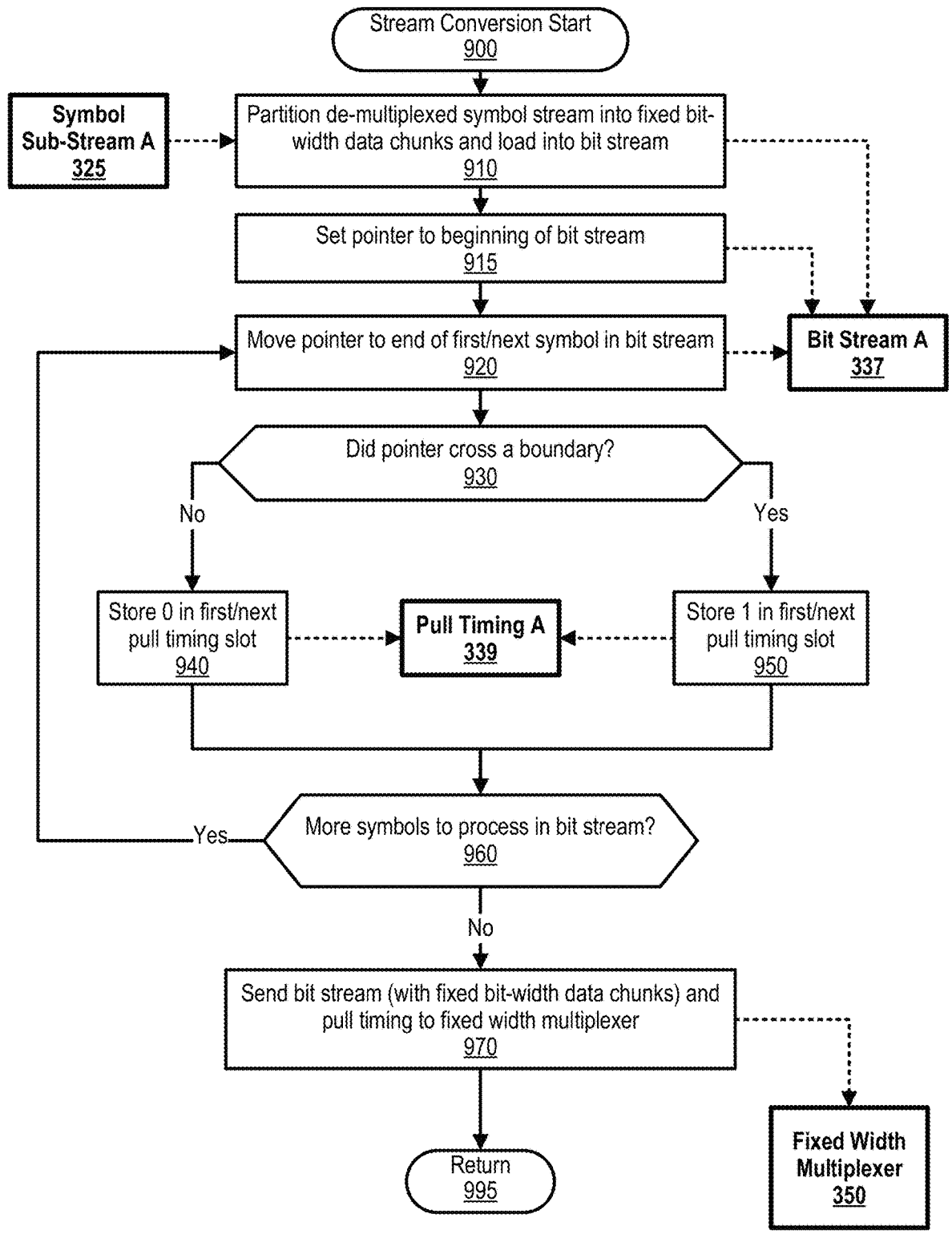
FIG. 9 is a flowchart showing steps taken by a stream converter to convert a symbol sub-stream into a bit stream with fixed bit-width data chunks and generate pull timing corresponding to the fixed bit-width data chunks.

FIG. 9 is a flowchart showing steps taken by a stream conversion process to convert a symbol sub-stream into a bit stream with fixed bit-width data chunks and generate pull timing corresponding to the fixed bit-width data chunks. The example shown in FIG. 9 shows steps taken by stream converter A 335 processing symbol sub-stream A 325. As discussed herein, the number of stream converters to convert the multiple symbol sub-streams is based on the number of symbol sub-streams produced by de-multiplexer 320, and each of the stream converters perform the steps shown in FIG. 9. In one embodiment, symbol encoder 300 may utilizes less stream converters than symbol sub-streams during the conversion process, such as utilizing one stream converter to convert multiple symbol sub-streams.

Processing commences at 900 whereupon, at step 910, the process partitions symbol sub-stream A 320 into fixed bit-width data chunks, such as 16 bits, and loads the fixed bit-width data chunks into bit stream 337. In one embodiment, the process loads the fixed bit-width data chunks into a temporary storage area and flags the boundaries of each of the fixed bit-width data chunks. At step 915, the process sets a pointer to the beginning of the bit stream and, at step 920, the process moves the pointer to end of the first symbol.

The process then determines as to whether the pointer crossed a fixed bit-width boundary such as boundary 615 shown in FIG. 6 (decision 930). The process performs this determination step because, at the destination system, the fixed width decoder will request another fixed bit-width data chunk from bit stream partitioner 365 when a symbol crosses a buffer boundary, which is the same size as the fixed bit-width data chunk.

If the pointer crossed a boundary, then decision 930 branches to the 'yes' branch whereupon, at step 950, the process stores a "1" in the first slot of pull timing A 339. On the other hand, if the pointer did not cross a fixed bit-width boundary, then decision 930 branches to the 'no' branch whereupon, at step 940, the process stores a "0" in the first slot of pull timing A 339. Referring back to FIG. 6, the example in FIG. 6 shows that the end of the first symbol "S1" does not cross boundary 610.

The process determines as to whether there are more symbols to process in bit stream A 337 (decision 960). If there are more symbols in bit stream A 337 to process, then decision 960 branches to the 'yes' branch which loops back to move the pointer to the end of the next symbol and evaluate whether the pointer crossed a boundary. Referring to FIG. 6, the process moves the pointer to the end of symbol "S3," which does cross boundary 610. This looping continues until there are no more symbols to process in bit stream A 337, at which point decision 960 branches to the 'no' branch exiting the loop. In one embodiment, at this point, there may be symbols that have not been emitted because their end did not move the pointer across a fixed width boundary. In this embodiment, processing may emit another fixed width chunk that includes these symbols.

At step 970, the process sends bit stream A 337 (includes the fixed bit-width data chunks) and pull timing A 339 to fixed width multiplexer 350. As shown in FIG. 10, the fixed width multiplexer combines the multiple bit streams from the multiple stream converters based on their respective pull timing. FIG. 9 processing thereafter returns to the calling routine (see FIG. 8) at 995.

FIG. 10 is a flowchart showing steps taken by a fixed width multiplexer to combine fixed bit-width data chunks from multiple bit streams into a multiplexed bit stream based on pull timing information. Processing commences at 1000, whereupon at step 1010, the process loads initial data chunks into multiplexed bit stream 355 in order from bit stream 337, then bit stream 342, then bit stream 337, and then bit stream 342. Processing performs the initial load in this manner to simulate how the destination's fixed width decoders A 370 and B 375 will perform an initial load (see FIG. 12 and corresponding text for further details).

The process determines as to whether the first slot in pull timing A 339 includes a "1," indicating that one of bit stream A 337's symbols crossed a boundary and, as such, the destination system's fixed width decoder A 370 will request another fixed bit-width data chunk (decision 1020). If the first slot in pull timing A 339 includes a "1," then decision 1020 branches to the 'yes' branch whereupon, at step 1030, the process loads the next fixed bit-width data chunk from bit stream A 337. On the other hand, the first slot in pull timing A 339 does not include a "1," then decision 1020 branches to the 'no' branch.

The process then determines as to whether the first slot in pull timing B 344 includes a "1," indicating that one of bit stream B 342's symbols crossed a boundary and, as such, the destination system's fixed width decoder B 375 will request another fixed bit-width data chunk (decision 1040). If the first slot in pull timing B 344 includes a "1," then decision 1040 branches to the 'yes' branch whereupon, at step 1050, the process loads the next fixed bit-width data chunk from bit stream B 342. On the other hand, the first slot in pull timing B 344 does not include a "1," then decision 1040 branches to the 'no' branch.

The process then determines as to whether the bit streams have ended (decision 1060). If the bit streams have not ended, then decision 1060 branches to the 'no' branch which loops back to continue processing the bit streams. This looping continues until the bit streams end, at which point decision 1060 branches to the yes' branch exiting the loop. In one embodiment, processing also loads one or more "dummy" chunk into multiplexed bit stream 355 at this point. FIG. 10 processing thereafter returns to the calling routine (see FIG. 8) at 1095.

FIG. 11 is a flowchart showing steps by a destination system to perform parallel decoding of an incoming multiplexed bit stream. Referring to FIG. 3, symbol decoder 360 includes fixed width decoder A 370 and fixed width decoder B 375, which concurrently decodes symbols included in multiplexed bit stream 355. As discussed earlier, bit stream partitioner 365 partitions multiplexed bit stream 355 into fixed bit-width data chunks and provides the fixed bit-width data chunks as requested by fixed width decoder A 370 and fixed width decoder B 375.

Fixed width decoder A 110 processing commences at 1100 whereupon, at step 1105, fixed width decoder A 370 requests a first fixed bit-width data chunk from bit stream partitioner 365 and loads the first fixed bit-width data chunk into its first buffer (see FIG. 12 and corresponding text for further details). Fixed width decoder B 375 processing concurrently commences at 1150 whereupon, at step 1155, fixed width decoder B 375 requests the next fixed bit-width data chunk (second chunk) from bit stream partitioner 1165 and loads the second fixed bit-width data chunk into its first buffer.

At step 1110, fixed width decoder A 370 requests the next fixed bit-width data chunk (third chunk) and loads it in its second buffer. Likewise, at step 1160, fixed width decoder B 375 requests the next fixed bit-width data chunk (fourth chunk) and loads it in its second buffer. At this point, both of fixed width decoder A 370's buffers and fixed width decoder B 375's buffers are full.

At step 1115, fixed width decoder A 370 sets its pointer to the beginning of its first buffer and, at step 1120, fixed width decoder A 370 decodes the first symbol & loads the decoded symbol into decoded symbol stream A 380 and moves the pointer to the beginning of the next symbol. Fixed width decoder A 370 determines as to whether the pointer crossed the first buffer boundary and reached the second buffer, indicating that another fixed bit-width data chunk should be requested from bit stream partitioner 365 (decision 1125). If the pointer did not cross the first buffer boundary, then decision 1125 branches to the 'no' branch which loops back to process the next symbol and move the pointer. This looping continues until the pointer crosses the first buffer boundary, at which point decision 1125 branches to the yes' branch exiting the loop.

Fixed width decoder A 370 determines as to whether bit stream partitioner 365 includes more fixed bit-width data chunks (decision 1130). If bit stream partitioner 365 includes more fixed bit-width data chunks, then decision 1130 branches to the 'yes' branch which loops back to shift the second buffer's contents to first buffer (step 1135) and request another fixed bit-width data chunk from bit stream partitioner 365 and it load into its second buffer (step 1140). This looping continues until there are no more fixed bit-width data chunks to process, at which point decision 1130 branches to the 'no' branch exiting the loop. and fixed width decoder A 370 processing thereafter ends at 1145.

Fixed width decoder A 370 determines as to whether there are more symbols remaining in its buffers to decode (decision 1142). If there are more symbols remaining in its buffers to decode, then decision 1142 branches to the 'yes' branch which loops back to decode the next symbol. This looping continues until there are no more symbols remaining in its buffers to decode, at which point decision 1142 branches to the 'no' branch exiting the loop and fixed width decoder A 370 processing ends at 1145.

Fixed width decoder B 375 concurrently performs similar steps as fixed width decoder A 370. Fixed width decoder B 375, at step 1165, sets its pointer to the beginning of its first buffer and, at step 1170, fixed width decoder B 375 decodes the first symbol & loads the decoded symbol into decoded symbol stream B 385 and moves the pointer to the next symbol. Fixed width decoder B 375 determines as to whether the pointer crosses the first buffer's boundary and reaches the second buffer, indicating that another fixed bit-width data chunk should be requested from bit stream partitioner 365 (decision 1175). If the pointer did not cross the first buffer boundary, then decision 1175 branches to the 'no' branch which loops back to process the next symbol and move the pointer. This looping continues until the pointer crosses the first buffer's boundary, at which point decision 1175 branches to the 'yes' branch exiting the loop.

Fixed width decoder B 375 determines as to whether bit stream partitioner 365 includes more fixed bit-width data chunks (decision 1180). If bit stream partitioner 365 includes more fixed bit-width data chunks, then decision 1180 branches to the 'yes' branch which loops back to shift the second buffer's contents to first buffer (step 1185) and request another fixed bit-width data chunk from bit stream partitioner 1165 and it load into its second buffer (step 1190). This looping continues until there are no more fixed bit-width data chunks to process, at which point decision 1180 branches to the 'no' branch exiting the loop.

Fixed width decoder B 375 determines as to whether there are more symbols remaining in its buffers to decode (decision 1192). If there are more symbols remaining in its buffers to decode, then decision 1192 branches to the 'yes' branch which loops back to decode the next symbol. This looping continues until there are no more symbols remaining in its buffers to decode, at which point decision 1192 branches to the 'no' branch exiting the loop and fixed width decoder B 375 processing ends at 1195.

FIG. 12 is a diagram showing an example of multiple fixed width decoders interfacing with a bit stream partitioner to request and process fixed bit-width data chunks.

Fixed width decoder A 370 includes first buffer 1200 and second buffer 1210. Similarly, fixed width decoder B 375 includes first buffer 1220 and second buffer 1230. The size of the buffers match the size of the fixed bit-width data chunks that were partitioned at symbol encoder 300 (e.g., 16 bits each). Bit stream partitioner 365 receives multiplexed bit stream 355 and partitions multiplexed bit stream 355 into fixed bit-width data chunks. Referring to FIG. 5, the fixed bit-width data chunks in order are A1, B1, A2, B2, A3, B3, B4, B5, A4, A5, and B6.

Fixed width decoder A 370 and fixed width decoder B 375 request fixed bit-width data chunks from bit stream partitioner 365 in round-robin order to initially load their corresponding buffers. As such, fixed width decoder A 370 receives chunk A1 and loads it into first buffer 1200. Fixed width decoder B 375 then receives chunk B1 and loads it into first buffer 1220. Next, fixed width decoder A 370 receives chunk A2 and loads it into second buffer 1210. Then, fixed width decoder B 375 receives chunk B2 and loads it into second buffer 1230.

At this point both decoders are ready to begin decoding the variable length symbols. As discussed herein, the decoders request additional fixed bit-width data chunks from bit stream partitioner 365 when they decode a symbol that crosses the boundary between their first buffer and their second buffer. When this occurs, the decoders shift the contents from their second buffer to their first buffer and load the newly received fixed bit-width data chunk into their second buffer.

Regarding the example shown in FIG. 12, fixed width decoder A 370 decodes symbol S1 in parallel with fixed width decoder B 375 decoding symbol S2. Neither decoder requests another fixed bit-width data chunk at this point because symbols S1 and S2 did not cross the first buffer boundary. Fixed width decoder A 370 then decodes symbol S3 in parallel with fixed width decoder B 375 decoding symbol S4. Fixed width decoder A 370 requests a fixed bit-width data chunk from bit stream partitioner 365 because symbol S3 crossed the first buffer 1200's boundary, and fixed width decoder B 375 also requests a fixed bit-width data chunk from bit stream partitioner 365 because symbol S4 crossed the first buffer 1220's boundary. The outputs of both decoders are fed into combiner 390 and combined into decoded symbol stream 395 as shown in FIG. 3.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method implemented by an information handling system, the method comprising:
    selecting a symbol from a plurality of first symbols included in a first bit stream that is partitioned into at least a first data chunk and a second data chunk, wherein a beginning of the selected first symbol resides in the first data chunk and the plurality of first symbols are of a plurality of different symbol lengths, and wherein the first data chunk and the second data chunk are of a fixed width size that is based on a longest one of the plurality of different symbol lengths;

generating a first pull timing indicator in response to determining that at least a portion of the selected first symbol resides in the second data chunk;

generating a multiplexed bit stream by combining the first bit stream with a second bit stream based on the first pull timing indicator; and transmitting the multiplexed bit stream to a destination system.

2. The method of claim 1 wherein the second bit stream is partitioned into at least a third data chunk and a fourth data chunk, the method further comprising:

selecting a symbol from a plurality of second symbols included in the second bit stream, wherein a beginning of the selected second symbol resides in the third data chunk;

generating a second pull timing indicator in response to determining that at least a portion of the selected second symbol resides in the fourth data chunk; and combining the first bit stream with the second bit stream based on the first pull timing indicator and the second pull timing indicator, wherein the multiplexed bit stream is organized in order as the first data chunk, the second data chunk, the third data chunk, and the fourth data chunk.

3. The method of claim 2 further comprising:

utilizing a single stream converter to generate the first pull timing indicator and the second pull timing indicator.

4. The method of claim 1 further comprising:

encoding an uncompressed byte stream into an initial symbol stream comprising a plurality of symbols; and partitioning the initial symbol stream into the first bit stream and the second bit stream, wherein the partitioning also partitions the plurality of symbols into the plurality of first symbols and the plurality of second symbols.

5. The method of claim 4 further comprising:

partitioning, by the destination system, the multiplexed bit stream into a plurality of fixed width data chunks;

decoding the plurality of symbols included in the plurality of fixed width data chunks using a plurality of decoders, resulting in a plurality of decoded symbol sub-streams;

combining the plurality of decoded symbol sub-streams into a decoded symbol stream; and decoding the decoded symbol stream, resulting in a reconstructed byte stream.

6. The method of claim 5 wherein each of the plurality of decoders includes a first buffer and a second buffer that are both based on the fixed width size of the plurality of fixed width data chunks, the method further comprising:

decoding a selected one of the plurality of symbols located in the first buffer;

determining that the selected symbol reaches into the second buffer; and in response to determining that the selected symbol reaches into the second buffer:

shifting contents from the second buffer into the first buffer; and requesting a subsequent fixed width data chunk.

7. An information handling system comprising:

one or more processors;

a memory coupled to at least one of the processors;

a set of computer program instructions stored in the memory and executed by at least one of the processors in order to perform actions of:

selecting a symbol from a plurality of first symbols included in a first bit stream that is partitioned into at least a first data chunk and a second data chunk, wherein a beginning of the selected first symbol resides in the first data chunk and the plurality of first symbols are of a plurality of different symbol lengths, and wherein the first data chunk and the second data chunk are of a fixed width size that is based on a longest one of the plurality of different symbol lengths;

generating a first pull timing indicator in response to determining that at least a portion of the selected first symbol resides in the second data chunk;

generating a multiplexed bit stream by combining the first bit stream with a second bit stream based on the first pull timing indicator; and transmitting the multiplexed bit stream to a destination system.

8. The information handling system of claim 7 wherein the second bit stream is partitioned into at least a third data chunk and a fourth data chunk, and wherein the processors perform additional actions comprising:

selecting a symbol from a plurality of second symbols included in the second bit stream, wherein a beginning of the selected second symbol resides in the third data chunk;

generating a second pull timing indicator in response to determining that at least a portion of the selected second symbol resides in the fourth data chunk; and combining the first bit stream with the second bit stream based on the first pull timing indicator and the second pull timing indicator, wherein the multiplexed bit stream is organized in order as the first data chunk, the second data chunk, the third data chunk, and the fourth data chunk.

9. The information handling system of claim 8 wherein the processors perform additional actions comprising:

utilizing a single stream converter to generate the first pull timing indicator and the second pull timing indicator.

10. The information handling system of claim 7 wherein the processors perform additional actions comprising:

encoding an uncompressed byte stream into an initial symbol stream comprising a plurality of symbols; and partitioning the initial symbol stream into the first bit stream and the second bit stream, wherein the partitioning also partitions the plurality of symbols into the plurality of first symbols and the plurality of second symbols.

11. The information handling system of claim 10 wherein the processors perform additional actions comprising:

partitioning, by the destination system, the multiplexed bit stream into a plurality of fixed width data chunks;

decoding the plurality of symbols included in the plurality of fixed width data chunks using a plurality of decoders, resulting in a plurality of decoded symbol sub-streams;

combining the plurality of decoded symbol sub-streams into a decoded symbol stream; and decoding the decoded symbol stream, resulting in a reconstructed byte stream.

12. The information handling system of claim 11 wherein each of the plurality of decoders includes a first buffer and a second buffer that are both based on the fixed width size of the plurality of fixed width data chunks, and wherein the processors perform additional actions comprising:
- decoding a selected one of the plurality of symbols located in the first buffer;
- determining that the selected symbol reaches into the second buffer; and
- in response to determining that the selected symbol reaches into the second buffer:
  - shifting contents from the second buffer into the first buffer; and
  - requesting a subsequent fixed width data chunk.

13. A computer program product stored in a computer readable storage medium, comprising computer program code that, when executed by an information handling system, causes the information handling system to perform actions comprising:
- selecting a symbol from a plurality of first symbols included in a first bit stream that is partitioned into at least a first data chunk and a second data chunk, wherein a beginning of the selected first symbol resides in the first data chunk and the plurality of first symbols are of a plurality of different symbol lengths, and wherein the first data chunk and the second data chunk are of a fixed width size that is based on a longest one of the plurality of different symbol lengths;
- generating a first pull timing indicator in response to determining that at least a portion of the selected first symbol resides in the second data chunk;
- generating a multiplexed bit stream by combining the first bit stream with a second bit stream based on the first pull timing indicator; and
- transmitting the multiplexed bit stream to a destination system.

14. The computer program product of claim 13 wherein the second bit stream is partitioned into at least a third data chunk and a fourth data chunk, and wherein the information handling system performs further actions comprising:
- selecting a symbol from a plurality of second symbols included in the second bit stream, wherein a beginning of the selected second symbol resides in the third data chunk;
- generating a second pull timing indicator in response to determining that at least a portion of the selected second symbol resides in the fourth data chunk; and
- combining the first bit stream with the second bit stream based on the first pull timing indicator and the second pull timing indicator, wherein the multiplexed bit stream is organized in order as the first data chunk, the second data chunk, the third data chunk, and the fourth data chunk.

15. The computer program product of claim 14 wherein the information handling system performs further actions comprising:
- utilizing a single stream converter to generate the first pull timing indicator and the second pull timing indicator.

16. The computer program product of claim 13 wherein the information handling system performs further actions comprising:
- encoding an uncompressed byte stream into an initial symbol stream comprising a plurality of symbols; and
- partitioning the initial symbol stream into the first bit stream and the second bit stream, wherein the partitioning also partitions the plurality of symbols into the plurality of first symbols and the plurality of second symbols.

17. The computer program product of claim 16 wherein the information handling system performs further actions comprising:
- partitioning, by the destination system, the multiplexed bit stream into a plurality of fixed width data chunks;
- decoding the plurality of symbols included in the plurality of fixed width data chunks using a plurality of decoders, resulting in a plurality of decoded symbol sub-streams;
- combining the plurality of decoded symbol sub-streams into a decoded symbol stream; and
- decoding the decoded symbol stream, resulting in a reconstructed byte stream.

* * * * *